United States Patent [19]
Akar et al.

[11] Patent Number: 5,235,273
[45] Date of Patent: Aug. 10, 1993

[54] APPARATUS FOR SETTING PIN DRIVER/SENSOR REFERENCE VOLTAGE LEVEL

[75] Inventors: Armagan A. Akar, San Jose, Calif.; Patrick L. Jennings, Kanagawa, Japan

[73] Assignee: Schlumberger Technologies, Inc., San Jose, Calif.

[21] Appl. No.: 729,510

[22] Filed: Jul. 12, 1991

[51] Int. Cl.[5] .................................... G01R 31/28
[52] U.S. Cl. ............................. 324/158 R; 371/22.1
[58] Field of Search .............. 324/158 R, 73.1, 158 F; 371/22.1, 22.6, 68.3

[56] References Cited

U.S. PATENT DOCUMENTS

| | | | |
|---|---|---|---|
| 4,168,796 | 9/1979 | Fulks et al. | 371/22.6 |
| 4,196,386 | 4/1980 | Phelps | 324/158 F |
| 4,907,230 | 3/1990 | Heller et al. | 371/22.1 |

Primary Examiner—Ernest F. Karlsen
Attorney, Agent, or Firm—Steven P. Koda

[57] ABSTRACT

An ATE system uses a single digital to analog converter and a single analog line for defining the reference voltage levels of a plurality of pin drivers and pin sensors. An advantage of using a single DAC is that the number of components for routing the reference voltage signals is reduced. Digital values for each high and low reference voltage level for each pin driver and each pin sensor are stored in memory. Such memory is addressed sequentially reference value by reference value, converted to analog format and routed along one common analog wire to a plurality of sample and hold circuits. The plurality of sample and hold circuits receive a pin driver/sensor address and the common analog signal. The address enables one of the plurality of sample and hold circuits and selects only one output line of the enabled sample and hold circuit. Such output line is coupled to a given reference terminal (e.g., reference high or reference low) of a given pin driver or a given pin sensor.

6 Claims, 3 Drawing Sheets

APPARATUS FOR SETTING PIN DRIVER/SENSOR REFERENCE VOLTAGE LEVEL

CROSS REFERENCE TO RELATED APPLICATION

This invention is related to U.S. patent application Ser. no. 07/649,081 filed Feb 1, 1991 for PIN DRIVER FOR IN-CIRCUIT TEST APPARATUS, now U.S. Pat. No. 5,146,159. The content of that application is incorporated herein by reference and made a part hereof.

BACKGROUND OF THE INVENTION

This invention relates to analog reference signal generation for pin drivers and pin sensors of an automated test equipment (ATE) system. More particularly, this invention relates to an apparatus for setting reference voltage levels from memory via a common analog line and common digital to analog converter for multiple pin drivers and pin sensors.

Automated test equipment (ATE) systems are used for testing printed circuit boards or integrated circuits. For either application, test signals are generated at pin drivers, while response signals are sensed at pin sensors. Typically, a pin driver or pin sensor receives analog reference voltage signals for defining a high reference level and a low reference level. Such reference levels are used to define the voltage swing by the pin driver between a logic high output and a logic low output. Such reference levels also are used by pin sensors to define the voltage swing for sensing a logic low and a logic high.

As an ATE has many pin drivers and pin sensors (i.e., one each per pin of a device under test or pin of a PCB), many reference signals are to be defined and coupled to the respective pin drivers and pin sensors. According to a conventional approach, a digital to analog converter is used for each reference signal of each pin driver and each pin sensor. The use of so many DACs creates undesirable expense and requires added space. Accordingly, there is a need to provide a more optimal configuration with fewer DACs.

SUMMARY OF THE INVENTION

According to the invention, an ATE system uses a single digital to analog converter and a single analog line for defining the reference voltage levels of a plurality of pin drivers and pin sensors. An advantage of using a single DAC is that the number of components for routing the reference voltage signals is reduced. As a result, space savings and cost savings are achieved.

According to one aspect of the invention, digital values for each reference high voltage level and reference low voltage level for each pin driver and each pin sensor are stored in memory. Such memory is addressed reference value by reference value, converted to analog format and routed along one common analog wire to a plurality of sample and hold circuits. Address signals are routed via a backplane to select the pin driver or pin sensor that receives such reference values. Such address signals also define whether the value is a reference high value or a reference low value.

According to another aspect of the invention, a plurality of sample and hold circuits receive the address signals and the common analog signal. The address signals enable one of the plurality of sample and hold circuits, while also selecting one output line of the enabled sample and hold circuit. Such output line is coupled to a given reference line (e.g., reference high or reference low) of a given pin driver or a given pin sensor.

According to another aspect of the invention, the memory which stores the digital reference voltage values is a dual port RAM device. By using dual ports, the ATE controller is able to load or update the RAM contents, while portions of the RAM are being output to define the analog signal for a select reference voltage value.

The invention will be better understood by reference to the following detailed description taken in conjunction with the accompanying drawings.

DESCRIPTION OF SPECIFIC EMBODIMENTS

Figure 1:
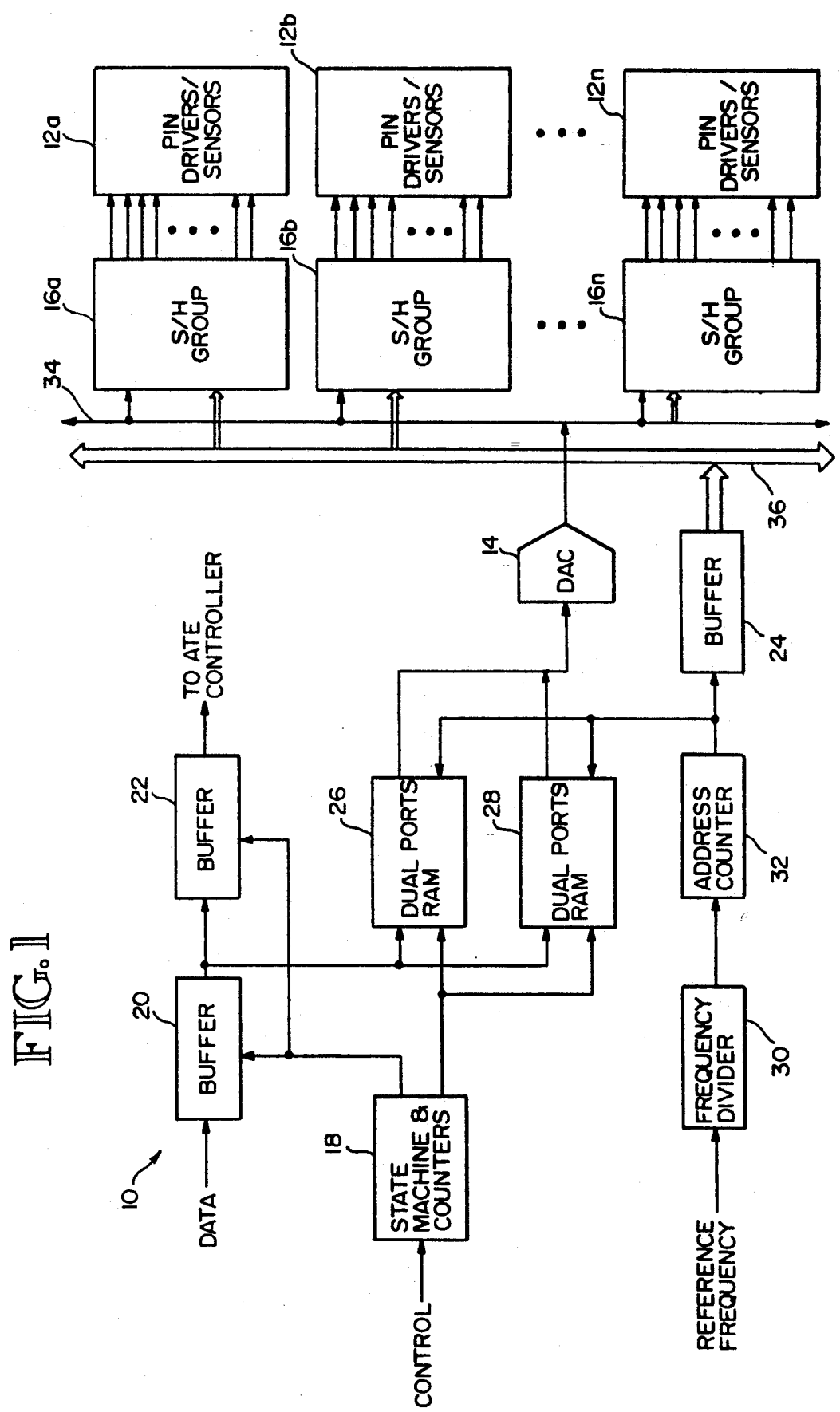
FIG. 1 is a block diagram of an apparatus for setting reference voltage levels for a plurality of pin drivers/sensors according to an embodiment of this invention.

FIG. 1 shows a block diagram of an apparatus 10 which sets reference voltage levels for a plurality of pin drivers/sensors 12 using one common digital to analog converter (DAC) 14. The analog signal output from the DAC 14 is routed to each group of sample and hold circuits 16. A pin driver/sensor address also is sent to the sample and hold circuit groups 16 selecting one output line of one sample and hold circuit within a select group. Such selected output line is coupled to a reference voltage input (not shown) (e.g., high reference or low reference) of a corresponding pin driver or pin sensor.

The apparatus 10 includes digital to analog converter (DAC) 14, sample and hold circuit groups 16, state machine and counter circuitry 18, buffers 20, 22, 24 dual port RAMs 26, 28, frequency divider 30 and address counter 32. The dual port RAMS 26, 28 store two 12-bit digital reference voltage values for each pin driver and pin sensor. One value is a high reference value. The other value is a low reference value. The RAMs 26, 28 receive a 12-bit address generated by the address counter 32. Such address also is routed through buffer 24 to select a specific sample and hold output line of a select sample and hold circuit. The selected output line corresponds to a reference high or reference low input to a corresponding pin driver or pin sensor.

An ATE controller loads the reference values and pin driver/sensor addresses (e.g. DATA) into RAMs 26, 28 via buffer 20. The ATE controller (not shown) triggers the state machine and counter circuits 18 to enable writes into the RAMs 26, 28 at incrementally-generated addresses. The counters of state machine and counters 18 generate sequential addresses.

Figure 2:
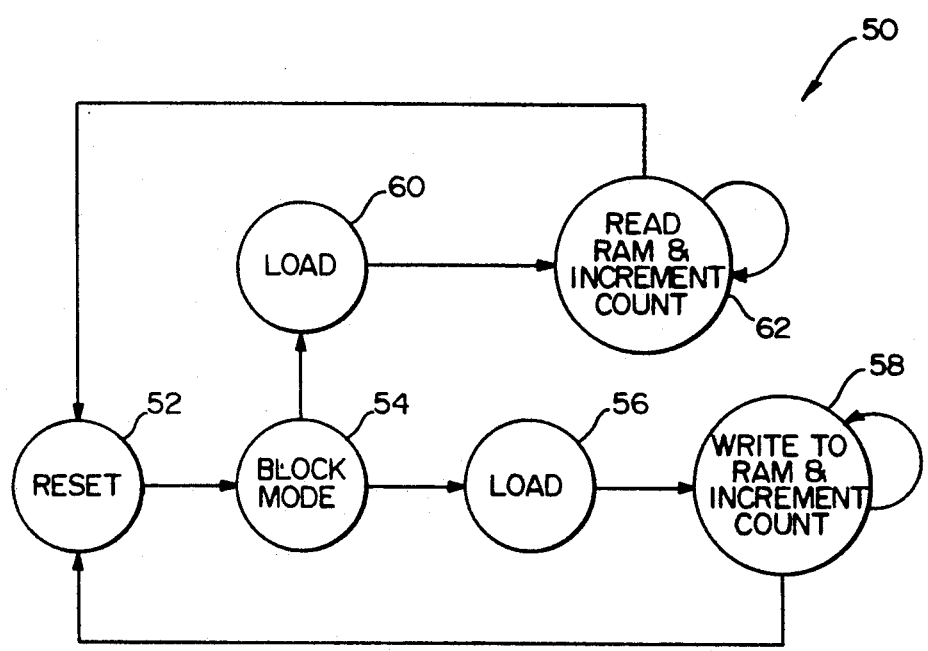
FIG. 2 is a block diagram for the state machine of FIG. 1.

FIG. 2 shows a flow diagram 50 for the state machine and counters circuitry 18. The state machine 18 receives a 2-word CONTROL communication from the ATE controller during the reset stage 52. The state machine then goes into a block mode stage 54. Block mode denotes that the read or write of RAMs 26, 28 is done for a block of data. For a CONTROL communication which specifies a write operation into RAM 26, 28, a starting RAM address is loaded at stage 56. Such address is the RAM 26, 28 location at which the write operation is to commence. At stage 58, DATA is written into the addressed RAM location via buffer 20, and the state machine counter is incremented. Such data is a reference value or a pin driver/sensor address. The state machine counter holds the RAM address to be accessed. The next RAM address, therefore, is generated at stage 58 when the count is incremented. Stage 58 then is re-executed for writing to the next consecutive RAM address. Such writing continues until a prescribed block size is written. Such block size in one embodiment is the entire allocated RAM 26, 28 address space, although lesser block sizes may be specified or implemented.

The ATE controller also may read the contents being loaded or already stored in RAMs 26, 28. For example, while DATA is being loaded into the RAMs 26, 28 via buffer 20, such DATA also is written to buffer 22 for output back to the ATE controller. As a result, the ATE controller can monitor the stored reference voltage values and pin driver/sensor addresses. In addition, the ATE controller may issue a 2-word CONTROL communication to read RAM 26, 28 contents. The state machine 18 receives the 2-word CONTROL communication from the ATE controller during the reset stage 52, as previously described. The state machine then goes into block mode stage 54. Because the control communication signifies a read operation, a starting RAM address is loaded at stage 60. Such address is the RAM 26, 28 location at which the read operation is to commence. At stage 62, data is read from the addressed RAM location via buffer 22, and the state machine counter is incremented. The counter holds the RAM address to be accessed. The next RAM address, therefore, is generated at stage 62 when the count is incremented. Stage 62 then is re-executed for reading the next consecutive RAM address. Such read operation continues until the entire block is read. Such block in one embodiment is the entire allocated RAM 26, 28 address space, although lesser block sizes may be specified or implemented.

Because the RAMs 26, 28 are dual port RAMs, a first port can be used for loading or accessing the RAMs 26, 28 according to a CONTROL communication, while a second port is used simultaneously for reading the RAM contents out to DAC 14 or buffer 24. According to one embodiment, the apparatus 10 continuously cycles through the RAM 26, 28 contents to sequentially set reference voltage levels at corresponding pin drivers and pin sensors. Address counter 32 generates the RAM addresses in sequence causing the data (e.g., reference value or pin driver/sensor address) at such RAM address to be output. The digital reference value data is output to DAC 14, while the corresponding pin driver/sensor address is loaded into buffer 24.

Address counter 32 generates the RAM addresses sequentially at a defined clock rate. According to one embodiment, the clock rate is defined from a 10 MHz reference frequency which is divided by 32 at frequency divider 30. The frequency divided signal is coupled to the address counter 32 causing address changes (i.e., address increments).

An output digital reference value is converted to analog format at DAC 14 to define an analog signal SH_REF (see FIG. 3) having a voltage level which is the high or low reference voltage level. The signal SH_REF is coupled to each sample and hold circuit card 16 via one common analog signal path 34. The 12-bit pin driver/sensor address is output to buffer 24 then to backplane 36 as signal SH_ADD (see FIG. 3). Each sample and hold circuit card 16 is coupled to the backplane for receiving the signal SH_ADD.

Figure 3:
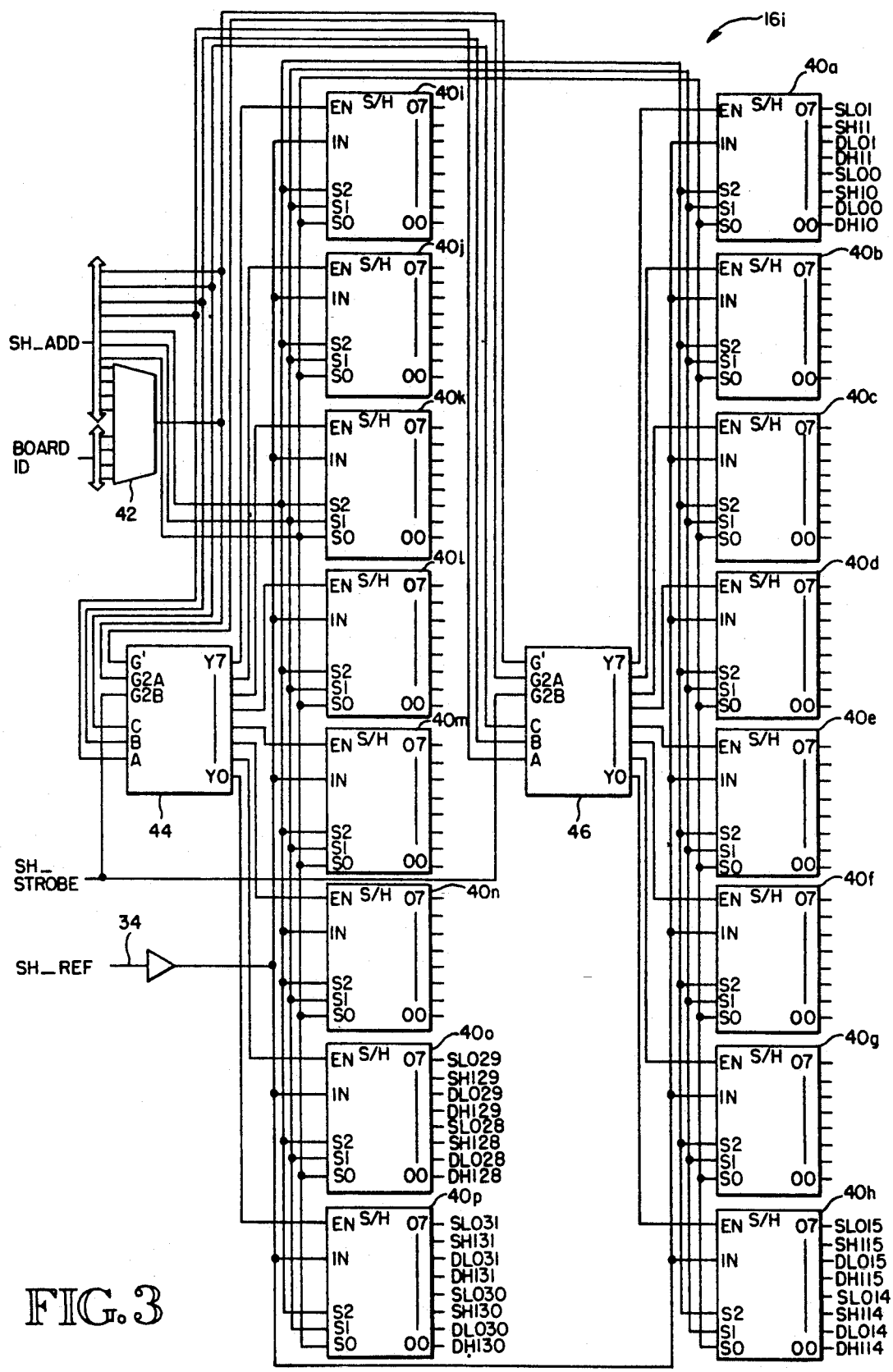
FIG. 3 is a schematic diagram of a multiple groups of sample and hold circuits for an ATE system which embodies the apparatus of this invention.

FIG. 3 shows a sample and hold circuit group 16i receiving the analog signal SH_REF and address signal SH_ADD. The group 16i also receives a 5-bit card-identification signal and a strobe signal SH_STROBE. The 5-bit card identification signal is derived from the 12-bit address signal SH_ADD. The SH_STROBE signal is generated by the clock signal of address counter 32. Each group 16 includes a plurality of sample and hold circuits 40, a comparator 42 and address decoders 44, 46. The comparator receives 5 bits of the address signal SH_ADD, along with the 5-bit board identification signal to generate a signal input to terminal G2a of the address decoders 44, 46. Three other address lines are input directly to the address decoders 44, 46. The address decoders 44, 46 in response generate an enable signal which is active for one of the sample and hold circuits 40. Each sample and hold circuit 40 also receives 3 address lines as output line select inputs S0-S2.

In one embodiment there are 16 sample and hold circuits 40a-40o per group 16. Each sample and hold circuit 40 receives the SH_REF analog signal 34, the enable signal EN, and 3 output line select signals S0-S2. Each sample and hold circuit 40 also includes 8 output terminals O0-O7. Referring to sample and hold circuit 40a, the outputs O0 to O7 correspond respectively to the signal path coupled to sensor 1's reference low voltage level, sensor 1's high reference voltage level, driver 1's low reference voltage level, driver 1's high reference voltage level, sensor 0's low reference voltage level, sensor 0's high reference voltage level, driver 0's low reference voltage level, and driver 0's high reference voltage level. The output select lines S0-S2 define which one of the eight output lines O0-O7 is selected, while the enable line defines which chip 40a-40o is selected. The output at the selected output line is analog signal SH_REF, which is received at terminal IN of each sample and hold circuit 40a-40o. Thus, the signal SH_ADD defining a pin driver/sensor address selects one output line of one sample and hold circuit 40, and thereby defines, which one pin driver or pin sensor and which one terminal (high reference level or low reference level) for such pin driver or pin sensor receives the analog reference voltage level (SH_REF).

For a detailed description of an embodiment of a pin driver or pin sensor to receive the reference voltage level output, refer to commonly-assigned U.S. patent application Ser. No. 07/649,081 filed Feb. 1, 1991 for PIN DRIVER FOR IN-CIRCUIT TEST APPARATUS, now U.S. Pat. No. 5,146,159. The content of that application is incorporated herein by reference and made a part hereof.

Although a preferred embodiment of the invention has been illustrated and described, various alternatives, modifications and equivalents may be used. For example, although a 12-bit pin driver/sensor address is described, limiting the embodiment to $2_{12}$ pin drivers/sensors, the bit length may vary. Further, although a 5-bit card identification signal is described, limiting the embodiment to 32 sample and hold groups 16, the bit length may vary to accommodate a different number of groups 16. Still further, the number of sample and hold circuits 40 per group 16 and the number of output lines per circuit 40 may vary. In addition, the rate at which the reference voltage levels are written to the pin drivers/sensors may vary. Therefore, the foregoing description should not be taken as limiting the scope of the inventions which are defined by the appended claims.

What is claimed is:

1. An apparatus for individually setting a high reference voltage level and a low reference voltage level at each one of a plurality of pin drivers and pin sensors, each one of said plurality of pin drivers and pin sensors having a high reference voltage input and a low reference voltage input, comprising:

means for storing a digital high reference voltage value and a corresponding pin driver/sensor address for each respective high reference voltage input of each one of said plurality of pin drives and pin sensors, said storing means also for storing a digital low reference voltage value and a corresponding pin driver/sensor address for each respective low reference voltage input of each one of said plurality of pin drivers and pin sensors;

means for addressing said storing means to output one of said respective high reference voltage values or of said low reference voltage values and the corresponding pin driver/sensor address;

a digital to analog converter receiving a sequence of reference voltage values output from said storing means for conversion to respective analog reference voltage levels, said sequence comprising high reference voltage values and low reference voltage values which are converted to respective analog high reference voltage levels and anlog low reference voltage levels;

a common signal path defining means for receiving each respective analog high and low reference voltage level in sequence;

a plurality of sampling means commonly coupled to said analog signal path defining means receiving said sequence of analog reference voltage levels and a corresponding sequence of said pin driver/sensor addresses, each one of said plurality of sampling means having a plurality of output lines, wherein a first output line of said plurality of output lines is coupled to a pin driver high reference voltage input, a second output line is coupled to a pin driver low reference voltage input, a third output line is coupled to a pin sensor high reference voltage input, and a fourth output line is coupled to a pin sensor low reference voltage input, wherein a first pin driver/sensor address of said corresponding sequence of pin driver/sensor addresses selects one output line of one of said plurality of sampling means, wherein for an analog high reference voltage level, said one output line is one of said first or said third output lines, and wherein for an analog low reference voltage level, said one output line is one of said second or said fourth output lines.

2. The apparatus of claim 1 in which each pin driver/sensor address of said corresponding sequence of pin driver/sensor addresses defines the pin driver or pin sensor to receive the corresponding analog reference voltage level and defines whether such corresponding analog reference voltage level is a high reference voltage level or a low reference voltage level.

3. The apparatus of claim 1, in which said addressing means comprises means for sequentially generating memory addresses for accessing said storing means to output a digital reference voltage value and a corresponding pin driver/sensor address.

4. The apparatus of claim 1 in which the storing means comprises a dual port RAM capable of being accessed at one port for a write operation or a first head operation, while being accessed at a second port for a second read operation.

5. An apparatus for individually setting a high reference voltage level and a low reference voltage level from memory via a common digital to analog converter and common analog signal path for each one of a plurality of pin drivers and pin sensors, each one of said plurality of pin drivers and pin sensors having a high reference voltage input and a low reference voltage input, comprising:

means for storing a digital high reference voltage value and a corresponding pin driver/sensor address for each respective high reference voltage input of each one of said plurality of pin drivers and pin sensors, said storing means also for storing a digital low reference voltage value and a corresponding pin driver/sensor address for each respective low reference voltage input of each one of said plurality of pin drivers and pin sensors;

means for addressing said storing means to output one of said respective high reference voltage values or of said low reference voltage values and the corresponding pin driver/sensor address;

a digital to analog converter receiving a sequence of reference voltage values output from said storing means for conversion to respective analog reference voltage levels, said sequence comprising high reference voltage values and low reference voltage values which are converted to respective analog high reference voltage levels and analog low reference voltage levels;

a common signal path defining means for receiving each respective analog high and low reference voltage level in sequence;

an address signal path defining means for receiving and routing a corresponding plurality of pin driver/sensor address;

a plurality of sampling means commonly coupled to said analog signal path defining means and said address signal path defining means receiving said sequence of analog reference voltage levels and a corresponding sequence of said pin driver/sensor addresses, each one of said plurality of sampling means having a plurality of output lines, wherein a first output line of said plurality of output lines is coupled to a pin driver high reference voltage input, a second output line is coupled to a pin driver low reference voltage input, a third output line is coupled to a pin sensor high reference voltage input, and a fourth output line is coupled to a pin sensor low reference voltage input, wherein a first pin driver/sensor address of said corresponding sequence of pin driver/sensor addresses selects one output line of one of said plurality of sampling means, wherein for an analog high reference voltage level, said one output line is one of said first or said third output lines, and wherein for an analog low reference voltage level, said one output line is one of said second or said fourth output lines;

wherein each one of said plurality of pin driver/sensor addresses identifies a destination pin driver or pin sensor to receive a corresponding analog reference voltage level and identifies whether such corresponding analog reference voltage level is a high reference voltage level or a low reference voltage level.

6. The apparatus of claim 5 in which the storing means comprises a dual port RAM capable of being accessed at one port for a write operation or a first read operation, while being accessed at a second port for a second read operation.

* * * * *